(12) United States Patent
Yang

(10) Patent No.: US 12,014,766 B2
(45) Date of Patent: Jun. 18, 2024

(54) SYSTEM FOR DETERMINING TARGET LOCKING TIME OF DELAY LOCKED LOOP OF MEMORY APPARATUS

(71) Applicant: NANYA TECHNOLOGY CORPORATION, New Taipei (TW)

(72) Inventor: Shu-Wei Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 142 days.

(21) Appl. No.: 17/846,213

(22) Filed: Jun. 22, 2022

(65) Prior Publication Data

US 2023/0420029 A1 Dec. 28, 2023

(51) Int. Cl.
G11C 11/4076 (2006.01)
G06F 1/10 (2006.01)
H03L 7/081 (2006.01)

(52) U.S. Cl.
CPC ............ G11C 11/4076 (2013.01); G06F 1/10 (2013.01); H03L 7/0816 (2013.01)

(58) Field of Classification Search
CPC .......................... G11C 11/4076; G11C 11/40
USPC ..................................................... 365/233.13
See application file for complete search history.

(56) References Cited

U.S. PATENT DOCUMENTS

| | | | |
|---|---|---|---|
| 5,440,514 A | 8/1995 | Flannagan et al. | |
| 2004/0199345 A1* | 10/2004 | Ananthanarayanan | H03L 7/0812 |
| | | | 702/79 |
| 2004/0247066 A1* | 12/2004 | Suda | H03L 7/0814 |
| | | | 331/25 |
| 2007/0216454 A1 | 9/2007 | Fan et al. | |
| 2014/0293718 A1* | 10/2014 | Prakash | G06F 13/1689 |
| | | | 365/193 |
| 2016/0292094 A1* | 10/2016 | Jeter | G06F 13/1668 |

(Continued)

FOREIGN PATENT DOCUMENTS

| | | |
|---|---|---|
| CN | 1518227 A | 8/2004 |
| TW | I321400 B | 3/2010 |

OTHER PUBLICATIONS

Office Action and and the search report mailed on Mar. 11, 2024 related to Taiwanese Application No. 112114801.

(Continued)

*Primary Examiner* — Muna A Techane
(74) *Attorney, Agent, or Firm* — Xuan Zhang

(57) ABSTRACT

A system and a method for determining a target locking time for a delay locked loop of a memory apparatus are provided. The system includes a signal generating device, a measuring device and a computing device. The signal generating device is configured to provide a first set of input signals to the memory apparatus in accordance with a first set of first operational parameters and a set of second operational parameters. The measuring device is configured to measure a first set of output signals from the memory apparatus in response to the first set of input signals, and to determine whether the delay locked loop fails at any combination of the first set of first operational parameters and the set of second operational parameters. The computing device is configured to determine a first candidate operational parameter to further determine the target locking time based on the first candidate operational parameter.

20 Claims, 8 Drawing Sheets

(56) References Cited

U.S. PATENT DOCUMENTS

2017/0075784 A1* 3/2017 Nakanishi ........... G06F 11/3692
2022/0166436 A1* 5/2022 Labbe ....................... G06F 1/28

OTHER PUBLICATIONS

Office Action and and the search report mailed on Jan. 3, 2024 related to U.S. Appl. No. 17/847,031.

* cited by examiner

SYSTEM FOR DETERMINING TARGET LOCKING TIME OF DELAY LOCKED LOOP OF MEMORY APPARATUS

TECHNICAL FIELD

The present disclosure relates to a system for determining a target locking time for a delay locked loop of a memory apparatus, and more particularly, to a system having a signal generating device.

DISCUSSION OF THE BACKGROUND

As CPU speeds continue to increase, memory performance becomes more of a limiting factor in system performance. An important aspect in improving memory performance relates to decreasing wait time before data can be transmitted to and from DRAM (dynamic random access memory) in a memory system.

The "Discussion of the Background" section is provided for background information only. The statements in the "Discussion of the Background" section are not an admission that the subject matter disclosed herein constitutes prior art with respect to the present disclosure, and no part of the "Discussion of the Background" section may be used as an admission that any part of this application constitutes prior art with respect to the present disclosure.

SUMMARY

One aspect of the present disclosure provides a system for determining a target locking time for a delay locked loop of a memory apparatus. The system includes a signal generating device, a measuring device, and a computing device. The signal generating device is configured to provide a first set of input signals to the memory apparatus in accordance with a first set of first operational parameters and a set of second operational parameters. The measuring device is configured to measure a first set of output signals from the memory apparatus in response to the first set of input signals, and to determine whether the delay locked loop fails at any combination of the first set of first operational parameters and the set of second operational parameters. The computing device is configured to determine a first candidate operational parameter from the first set of first operational parameters under which the delay locked loop does not fail for each of the set of second operational parameters, and to further determine the target locking time based on the first candidate operational parameter.

Another aspect of the present disclosure provides a system for determining a target locking time for a delay locked loop of a memory apparatus. The system includes a signal generating device, a measuring device, and a display device. The signal generating device is configured to provide a first set of input signals to the memory apparatus in accordance with a first set of first operational parameters and a set of second operational parameters. The measuring device is configured to measure a first set of output signals from the memory apparatus in response to the first set of input signals, and to determine whether the delay locked loop fails at any combination of the first set of first operational parameters and the set of second operational parameters. The display device includes a first two-dimensional plot region including a first plurality of plot units each corresponding to one combination of the first set of first operational parameters and the set of second operational parameters. A plot unit of the first plurality of plot units shows a first color when the delay locked loop does not fail under the corresponding combination of the plot unit, and a second color when the delay locked loop fails under the corresponding combination of the plot unit.

Another aspect of the present disclosure provides a method for determining a target locking time for a delay locked loop of a memory apparatus. The method includes, a system inputting a first set of input signals to the memory apparatus in accordance with a first set of first operational parameters and a set of second operational parameters, the system measuring a first set of output signals from the memory apparatus in response to the first set of input signals to determine whether the delay locked loop fails at any combination of the first set of first operational parameters and the set of second operational parameters, the system determining a first candidate operational parameter from the first set of first operational parameters under which the delay locked loop does not fail for each of the set of second operational parameters, and the system determining the target locking time based on the first candidate operational parameter.

Under most circumstances, a memory apparatus should be stable after a relatively large locking time from the initial state. However, the memory apparatus may not actually require such a large locking time from the initial state to come into stable locking state. To more precisely obtain a target locking time, a system in accordance with some embodiments of the present disclosure can be used to determine a target locking time of the memory apparatus. With the method and system provided in the present disclosure, the latency of memory apparatus caused by improper locking time can be avoided.

The foregoing outlines rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It can also be appreciated by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the drawings, where like reference numbers refer to similar elements throughout the drawings, and:

DETAILED DESCRIPTION

Figure 1:
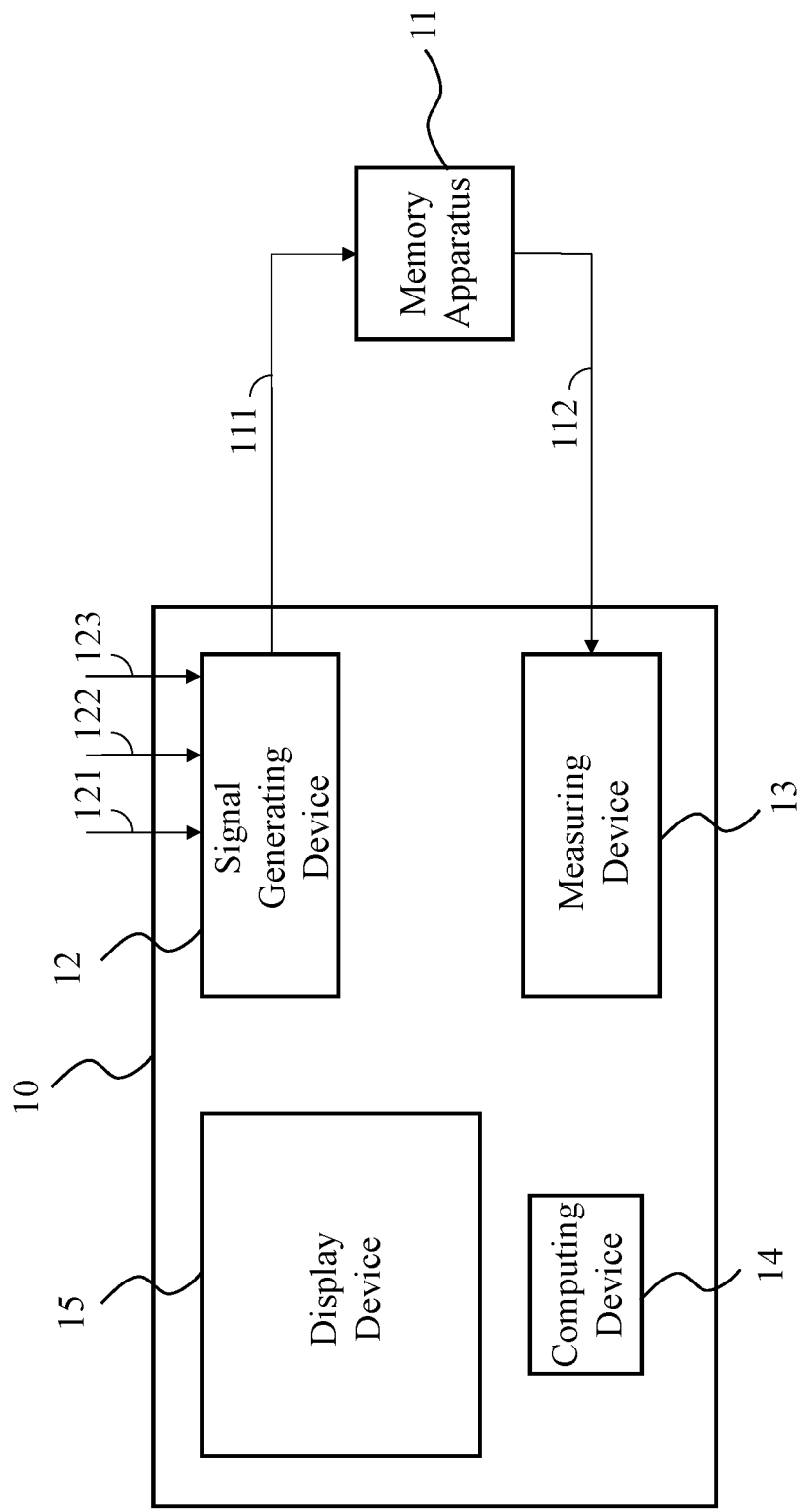
FIG. 1 is a schematic diagram of a system for testing a memory apparatus, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 9, 8, 7, 6, 5, 4, 3, 2, or 1% of the reported numerical value.

Synchronous communication is often used in modern electronic systems to achieve high data transmission rates to and from the DRAM in a memory system. To communicate synchronously, electronic systems use a clock signal as a timing reference so that data signals can be transmitted and received according to a known relationship to the timing reference. However, there is a difficulty in maintaining this relationship since any variation in the process, the voltage, the clock rate, and even the temperature may alter the relationship between the clock signal and the data signals, resulting in a reduction in timing margins. The issue becomes worse as the signaling frequencies increase, and limits the ability of electronic systems to communicate data signals at higher speeds.

At low operating speeds, a data valid window (the time over which data signal can be reliably sampled by a receiver) can be relatively large. Even in the presence of a substantial shift in the data valid window across operational extremes, the resulting data valid window can still be large enough to transmit and receive data signals properly. In the case of DRAM technologies such as SDRAM (synchronous dynamic random access memory), the data valid windows are normally large enough. However, for DRAM technologies with higher speeds such as DDR SDRAM (double data rate SDRAM), variations in process, voltage, and temperature may result in severe loss of the data valid window. Synchronizing the memory operation with a clock signal is even more critical for DDR SDRAM components, which provide data and control signal transitions on both the rising and falling edges of the clock signal.

A DLL (delay lock loop) can be used to maintain a fixed timing relationship between signals in environments where variations in process, voltage, clock rate, or temperature may cause such relationship to change over time. A DLL can continuously compare the relationship between two signals and provide feedback for adjusting and maintaining a fixed relationship therebetween.

Locking time refers to a time interval required by a DLL to achieve a stable locking state from an initial state. Generally, locking time relates to the speed of the phase detector in the DLL, the magnitude of the charging or discharging current, and the overall delay loop bandwidth.

As discussed, it can be challenging to set a target locking time so as to ensure that a memory apparatus such as a DDR SDRAM can operate stably despite the variations in the process, the voltage, the clock rate and the temperature.

One way of setting a target locking time is to use a relatively high locking time, such 1000 clock cycles. Under most circumstances, the memory apparatus should be stable after 1000 clock cycles from the initial state. However, the memory apparatus may not actually need the 1000 clock cycles to achieve stable locking, and the hundreds of clock cycles may be wasted for the memory apparatus.

To more precisely obtain a target locking time, a system in accordance with some embodiments of the present disclosure can be used to determine a target locking time for a DLL of a memory apparatus.

FIG. 1 is a schematic diagram of a system for testing a memory apparatus, in accordance with some embodiments of the present disclosure.

According to FIG. 1, the system 10 is configured to determine a target locking time for a DLL of a memory apparatus 11. The memory apparatus 11 may be tested after fabrication, and shipped thereafter.

In some embodiments, the system 10 may include hardware and software components that provide a suitable operational and functional environment for testing. In some embodiments, the system may include a signal generating device 12, a measuring device 13, a computing device 14, and a display device 15.

Signals, data, commands, or instructions can be transmitted between one or more of the signal generating device 12, the measuring device 13, the computing device 14, and the display device 15. Signals, data, commands, or instructions can be transmitted between the system 10 and the memory apparatus 11.

The signal generating device 12 can be configured to provide input signals to the memory apparatus 11. In some embodiments, the signal generating device 12 is configured to provide a first set of input signals 111 to the memory apparatus 11 in accordance with a first set of first operational parameters 121 and a set of second operational parameters 122. In some embodiments, the signal generating device 12 is configured to provide a second set of input signals 111 to the memory apparatus 11 in accordance with a second set of first operational parameters 121 and a set of third operational parameters 123.

In some embodiments, the first operational parameters 121, the second operational parameters 122 or the third operational parameters 123 may be input to the system 10 as shown in FIG. 1. In some embodiments, these operational parameters may be input by a manufacturer or a user of the memory apparatus. In some embodiments, the manufacturer or the user may input a minimum value, a maximum value, and a step value for these operational parameters, and the signal generating device 12 will automatically generate the desired operational parameters accordingly. In some embodiments, these operational parameters may be previously stored in the signal generating device 12. In some embodiments, the first operational parameters 121 are associated with locking times (tDLLK) of the memory apparatus 11. In some embodiments, the second operational parameters 122 are associated with clock periods (tCK) of the memory apparatus 11. In some embodiments, the third operational parameters 123 are associated with supply voltages (VDD) of the memory apparatus 11. In some embodiments, the number of parameters of the set of the third operational parameters 123 can be different from the number of parameters of the set of the second operational parameters 122.

The measuring device 13 can be configured to receive signals from the memory apparatus 11. In some embodiments, the measuring device 13 is configured to receive and measure a first set of output signals 112 from the memory apparatus 11 in response to the first set of input signals 111. In some embodiments, the measuring device 13 and the computing device 14 can be configured to determine whether the DLL fails at any combination of the first set of first operational parameters 121 and the set of second operational parameters 122. In some embodiments, the measuring device 13 is configured to receive and measure a second set of output signals 112 from the memory apparatus 11 in response to the second set of input signals 111, and to determine, with the assistance of the computing device 14, whether the DLL fails at any combination of the second set of first operational parameters 121 and the set of third operational parameters 123. In some embodiments, the first set of output signals 111 are data strobe (DQS) signals of the memory apparatus 11. In some embodiments, whether the DLL fails is determined based on whether the DQS signals are stable.

In some embodiments, the computing device 14 is configured to determine a first candidate operational parameter from the first set of first operational parameters 121 under which the DLL does not fail for each of the set of second operational parameters 122, and to further determine the target locking time based on the first candidate operational parameter. In some embodiments, the computing device 14 is further configured to determine a second candidate operational parameter from the second set of first operational parameters 121 under which the DLL does not fail for each of the set of third operational parameters 123, and to determine the target locking time based on both the first candidate operational parameter and the second candidate operational parameter. In some embodiments, the computing device 14 compares the first candidate operational parameter and the second candidate operational parameter to determine the target locking time.

In some embodiments, the memory apparatus 11 is a DDR SDRAM, DDR2 SDRAM (double data rate second-generation synchronous dynamic random access memory), DDR3 SDRAM (double data rate third-generation synchronous dynamic random access memory), DDR4 SDRAM (double data rate fourth-generation synchronous dynamic random access memory), or DDR5 SDRAM (double data rate fifth-generation synchronous dynamic random access memory).

The display device 15 can be configured to show one or more two-dimensional plot regions comprising a plurality of plot units each corresponding to one combination of the first operational parameters 121 and the second operational parameters 122 or one combination of the first operational parameters 121 and the third operational parameters 123. In some embodiments, the one or more two-dimensional plot regions can help determine the candidate operational parameters.

Figure 2:
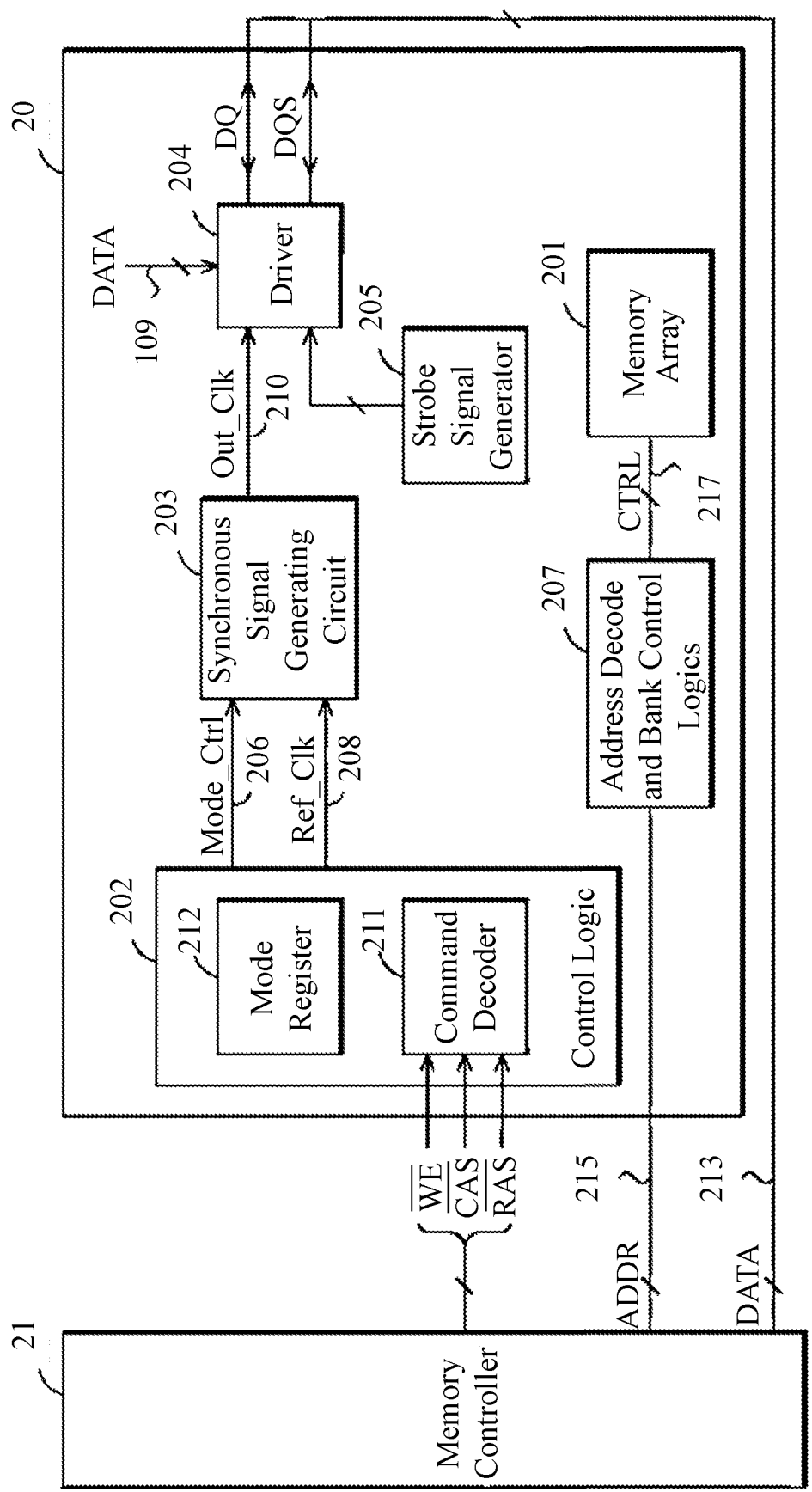
FIG. 2 is a block diagram of a double data rate synchronous dynamic random access memory (DDR SDRAM), in accordance with some embodiments of the present disclosure.

FIG. 2 is a block diagram of a double data rate synchronous dynamic random access memory, in accordance with some embodiments of the present disclosure.

In order to clarify the concept of this disclosure, FIG. 2 presents a simplified block diagram, in which only the elements relevant to this disclosure are shown. However, note that this disclosure should not be limited what is shown in FIG. 2. Memory apparatus 20 comprises a memory array 201, a control logic 202, a synchronous signal generating circuit 203, a driver 204, a strobe signal generator 205, and an address decode and bank control logics 207.

Memory array 201 is arranged to store data. The memory controller 21 applies addresses to the address decode and bank control logics 207 over an address bus ADDR 215 connected therebetween. The address decode and bank control logics 207 comprise at least an address decode logic, a bank control logic, and the corresponding logic circuits. The address decode and bank control logics 207 decode the received addresses and apply a plurality of control signals CTRL 217 to the memory array 201 according to the decoded addresses.

Control logic 202 is arranged to control read and write operations of memory array 201. Control logic 202 may further comprise a command decoder 211 and a mode register 212. Command decoder 211 decodes a plurality of signals received from a memory controller 21. The signals include at least a Write Enable (/WE), a Column Address Strobe (/CAS) and a Row Address Strobe (/RAS) as shown. Control logic 202 generates a plurality of mode control signals (represented here as Mode_Ctrl 206 shown in FIG.

2). Control logic 202 stores mode control signals in mode register 212 for controlling operations of memory apparatus 20.

Synchronous signal generating circuit 203 is arranged to align rising/falling or leading/trailing edges of synchronous output signals with input reference clock signal Ref_Clk 208 to reduce skew between synchronous output signal and input reference clock signal Ref_Clk 208. Synchronous signal generating circuit 203 further receives mode control signals Mode_Ctrl 206 and operates according to mode control signals Mode_Ctrl 206 (which will be discussed in more detail as follows).

Driver 204 is arranged to drive data bits (DQ) and data strobe signal (DQS) based on synchronous output signal Out_Clk 210 generated by synchronous signal generating circuit 203. The driver 204 sequentially receives the data from a multiplexer (not shown) via the data bus 209, a data strobe signal DQS from a strobe signal generator 205 and a synchronous output signal Out_Clk 210 from the synchronous signal generating circuit 203. The data strobe signal DQS has the same frequency as the input reference clock signal Ref_Clk 208 and is used by the memory controller 21 in latching data from the memory apparatus 20 during read operations. In response to the synchronous output signal Out_Clk 210, the driver 204 sequentially outputs the received data as corresponding data bits DQ in a DDR configuration, and also outputs the data strobe signal DQS.

Each data bit DQ and the data strobe signal DQS collectively define a data bus 213 coupled to the memory controller 21 which, during read operations, latches each bit on the data bus 213 responsive to the data strobe signal DQS. Driver 204 comprises a latch (not shown), which uses the rising/falling or leading/trailing edges of synchronous output signal generated by synchronous signal generating circuit 203 to latch data bits to DQ signal and data strobe signal DQS to the strobe I/O signal. In this manner, memory array 201 is operated based on synchronous output signal with little or no skew relative to the clock signal applied to the memory array 201.

In some embodiments, synchronous signal generating circuit 203 may comprise a delay locked loop.

Figure 3:
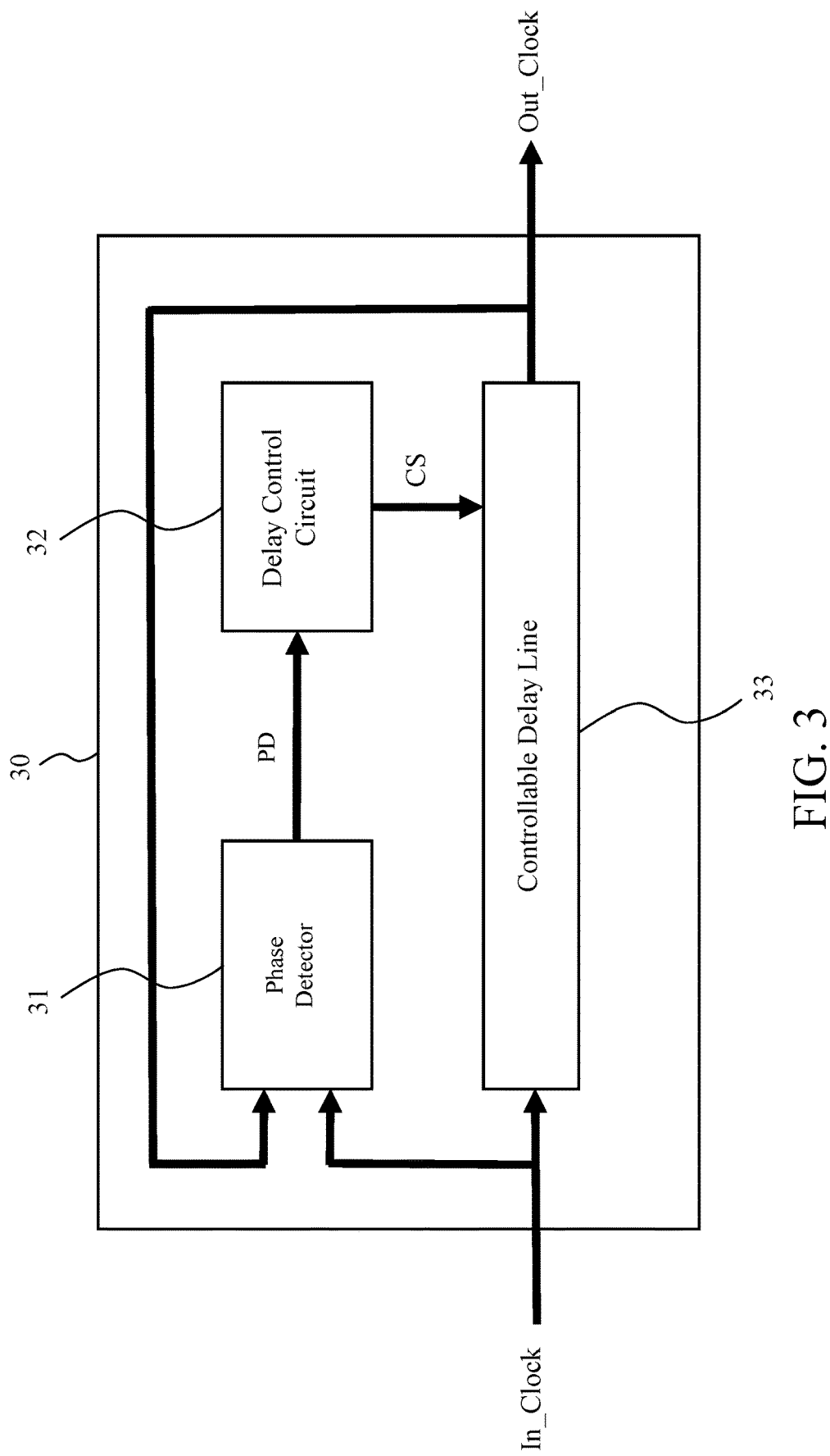
FIG. 3 is a block diagram of a delay locked loop, in accordance with some embodiments of the present disclosure.

FIG. 3 is a block diagram of a delay locked loop 30, in accordance with some embodiments of the present disclosure, which includes a phase detector 31, a delay control circuit 32, and a controllable delay line 33. The controllable delay line 33 delays the input clock signal In_Clock to generate an output clock signal Out_Clock according to a control signal CS from the delay control circuit 32. The phase detector 31 detects the phases of the input clock signal In_Clock and the output clock signal Out_Clock to determine the phase relations there between (i.e. which phase leads the other phase), thereby generating a phase detecting result PD. The phase detecting result PD is transmitted to the delay control circuit 32, which controls delay amount of the controllable delay line 33 according to the phase detecting result PD. In this way, the output signal Out_Clock with desired phase information can be acquired.

Figure 4:
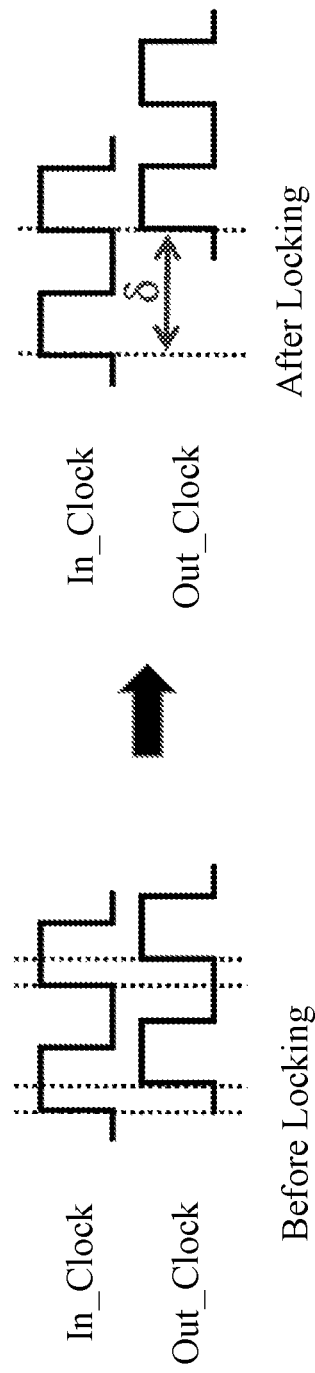
FIG. 4 illustrates the locking between In_Clock signal and Out_Clock signal, in accordance with some embodiments of the present disclosure.

FIG. 4 illustrates locking between In_Clock signal and Out_Clock signal, in accordance with some embodiments of the present disclosure, in which, initially, the output clock signal (namely Out_Clock) is not in-phase with the input clock signal (namely In_Clock). But after the DLL is locked, their phase difference will almost disappear as shown in FIG. 4. During the phase-locking process, the Out_Clock signal is successively compared with the In_Clock signal to decide the phase detecting result PD of a one-bit signal, called lead/lag via the phase detector 31 in FIG. 3. When lead/lag signal is "1", it means the Out_Clock signal signal is ahead of the In_Clock signal in the timings of their rising edges. When lead/lag signal is "0", it means the Out_Clock signal is behind the In_Clock signal. The lead/lag signal will guide the delay control circuit 32 in FIG. 3 to update the value of the control signal CS so that the phase difference between the Out_Clock signal and the In_Clock signal will gradually diminish. After phase-locking, the delay across the controllable delay line 33 in FIG. 3 will equal the clock period of the In_Clock signal in the ideal case.

Figure 5:
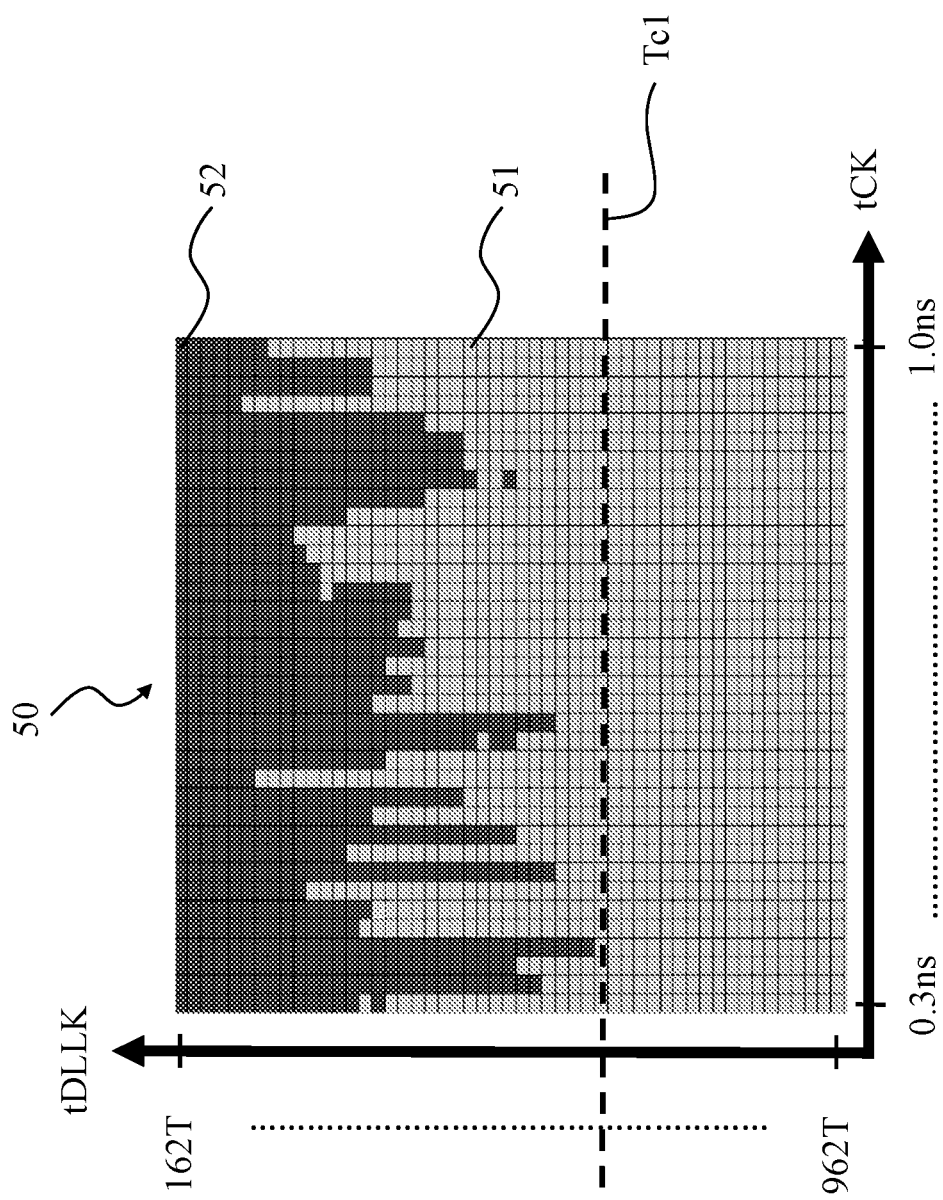
FIG. 5 is a schematic of a two-dimensional plot region, in accordance with some embodiments of the present disclosure.

FIG. 5 is a schematic of a two-dimensional plot region, in accordance with some embodiments of the present disclosure. As shown in FIG. 5, in some embodiments, the display device 15 as illustrated in FIG. 1 can comprise a two-dimensional plot region 50. In some embodiments, the two-dimensional plot region 50 comprises a plurality of plot units each corresponding to one combination of the first set of first operational parameters 121 and the set of second operational parameters 122. In some embodiments, the first operational parameters 121 are associated with locking times (tDLLK) of the memory apparatus 11. In some embodiments, the second operational parameters 122 are associated with clock periods (tCK) of the memory apparatus 11.

The plot units of the two-dimensional plot region 50 can be presented in different colors depending on the results of the DLL. In some embodiments, a plot unit 51 of the plurality of plot units shows a first color because the DLL does not fail under the corresponding combination of the plot unit 51. In some embodiments, a plot unit 52 of the plurality of plot units shows a second color because the DLL fails under the corresponding combination of the plot unit 52.

In some embodiments, the corresponding first operational parameters tDLLK of the plot units along one dimension of the two-dimensional plot region 50 are arranged in descending order. For example, FIG. 5 shows that the first operational parameters tDLLK include the time of clock cycles from the time of 162 clock periods (162T) to the time of 962 clock periods (962T). As illustrated in FIG. 5, the first operational parameters tDLLK are arranged from the bottom to the top alone a vertical axis of the two-dimensional plot region 50 in descending order.

Referring to FIG. 5, each of the plot units at the same location of the vertical axis of the two-dimensional plot region 50 corresponds to the same first operational parameter tDLLK. In some embodiments, the first operational parameters tDLLK can be set from various ranges (and with different step values) for testing. For example, the first operational parameters tDLLK can be from 50T to 1000T, from 100T to 900T, from 200T to 800T or any proper combinations. Similarly, various step values of the first operational parameters tDLLK can also be set for testing. Small step values will result in many iterations for testing but a more precise target locking time may be determined. Large step values will result in fewer iterations for testing but a less precise target locking time may be determined.

In some embodiments, the corresponding second operational parameters tCK of the plot units along one dimension of the two-dimensional plot region 50 are arranged in ascending order. For example, FIG. 5 shows that the second operational parameters tCK include the clock periods from 0.3 ns to 1 ns. As illustrated in FIG. 5, the second operational parameters tCK are arranged from the left to the right alone a horizontal axis of the two-dimensional plot region 50 in ascending order. Each of the plot units at the same location of the horizontal axis of the two-dimensional plot region 50 corresponds to the same second operational parameter tCK.

In some embodiments, the second operational parameters tCK can be set from various ranges (and with different step values) for testing, and the ranges to be set depend on the type of memory apparatus under test. For example, for a DDR SDRAM, the second operational parameters tCK can be from 5 ns to 7.5 ns, for a DDR2 SDRAM, the second operational parameters tCK can be from 2.5 ns to 3.75 ns, for a DDR3 SDRAM, the second operational parameters tCK can be from 1.25 ns to 1.88 ns, for a DDR4 SDRAM, the second operational parameters tCK can be from 0.6 ns to 1 ns, and, for a DDR5 SDRAM, the second operational parameters tCK can be from 0.3 ns to 0.6 ns. It can be contemplated, however, that any combinations of the noted ranges or any suitable range can be used for testing. Similarly, various step values of the second operational parameters tCK can also be set for testing. Small step values will result in many iterations for testing but a more precise target locking time may be determined. Large step values will result in fewer iterations for testing but a less precise target locking time may be determined.

Referring to FIG. 1 and FIG. 5, in some embodiments, the computing device 14 determines the first candidate operational parameter based on a distribution of the first color and the second color on the two-dimensional plot region 50. Since a plot unit shows a second color when the DLL fails under the corresponding combination of the plot unit, the computing device 14, in some embodiments, selects the first candidate operational parameter which corresponds to a target locking time ensuring stability for all of the second operational parameters tCK. For example, referring to FIG. 5, the dotted-line Tc1 may indicate a candidate locking time, and the first candidate operational parameter can be obtained accordingly.

Figure 6:
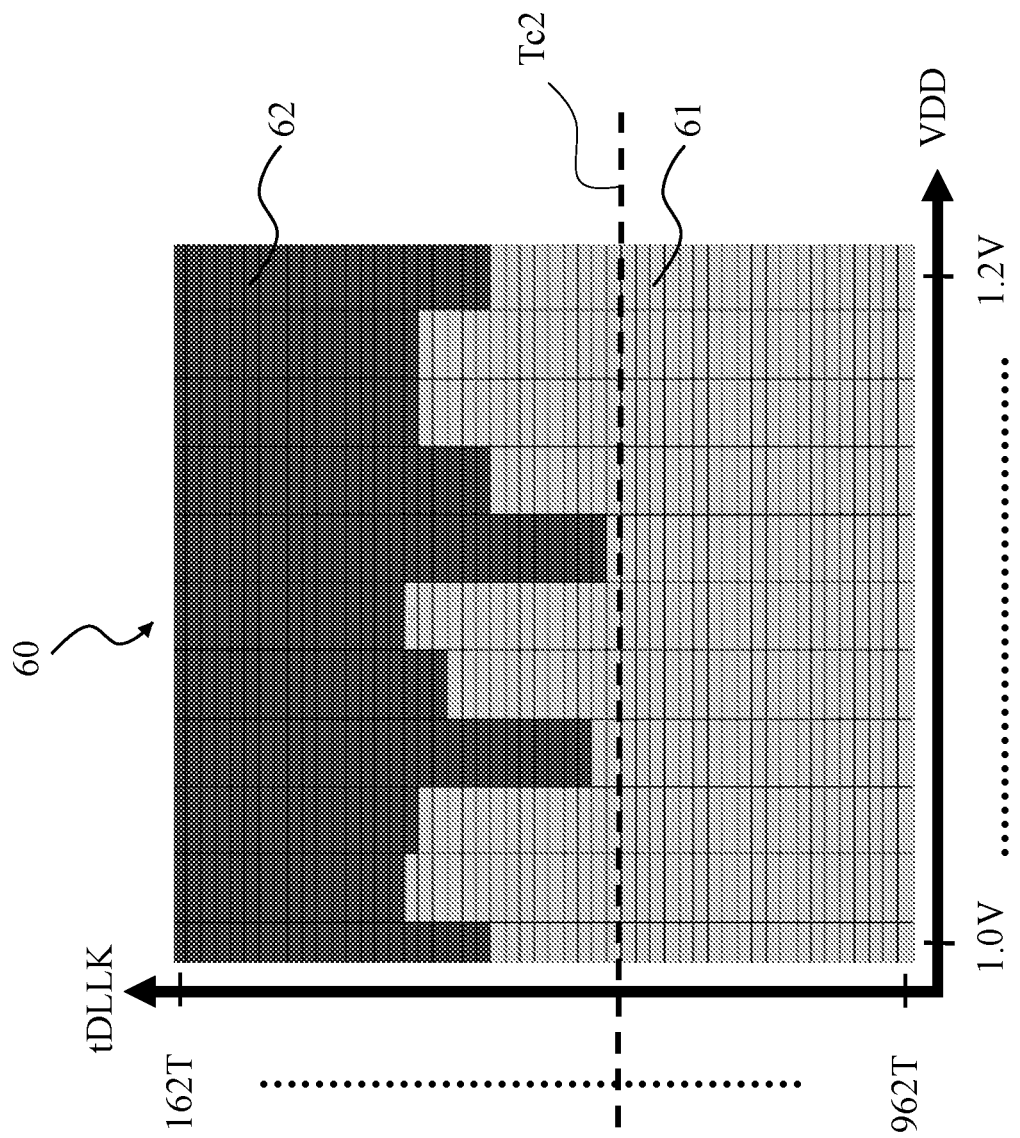
FIG. 6 is a schematic of a two-dimensional plot region, in accordance with some embodiments of the present disclosure.

FIG. 6 is a schematic of a two-dimensional plot region, in accordance with some embodiments of the present disclosure. As shown in FIG. 6, in some embodiments, the display device 15 as illustrated in FIG. 1 can comprise a two-dimensional plot region 60. In some embodiments, the two-dimensional plot region 60 comprises a plurality of plot units each corresponding to one combination of the second set of first operational parameters 121 and the set of third operational parameters 123. In some embodiments, the first operational parameters 121 are associated with locking times (tDLLK) of the memory apparatus 11. In some embodiments, the third operational parameters 123 are associated with supply voltages (VDD) of the memory apparatus 11.

The plot units of the two-dimensional plot region 60 can be presented in different colors depending on the results of the DLL. In some embodiments, a plot unit 61 of the plurality of plot units shows a first color because the DLL does not fail under the corresponding combination of the plot unit. In some embodiments, a plot unit 62 of the plurality of plot units shows a second color because the DLL fails under the corresponding combination of the plot unit 62.

In some embodiments, the corresponding first operational parameters tDLLK of the plot units along one dimension of the two-dimensional plot region 60 are arranged in descending order. For example, FIG. 6 shows that the first operational parameters tDLLK include the time of clock cycles from the time of 162 clock periods (162T) to the time of 962 clock periods (962T). As illustrated in FIG. 6, the first operational parameters tDLLK are arranged from the bottom to the top alone a vertical axis of the two-dimensional plot region 60 in descending order. Each of the plot units at the same location of the vertical axis of the two-dimensional plot region 60 corresponds to the same first operational parameter tDLLK.

In some embodiments, the first operational parameters tDLLK can be set from various ranges (and with different step values) for testing. For example, the first operational parameters tDLLK can be from 50T to 1000T, from 100T to 900T, from 200T to 800T, or any proper combination. Similarly, various step values of the first operational parameters tDLLK can also be set for testing. Small step values will result in many iterations for testing but a more precise target locking time may be determined. Large step values will result in fewer iterations for testing but a less precise target locking time may be determined.

In some embodiments, the corresponding third operational parameters VDD of the plot units along one dimension of the two-dimensional plot region 60 are arranged in ascending order. For example, FIG. 6 shows that the third operational parameters VDD include the supply voltage from 1.0V to 1.2V. As illustrated in FIG. 6, the third operational parameters VDD are arranged from the left to the right alone a horizontal axis of the two-dimensional plot region 60 in ascending order. Each of the plot units at the same location of the horizontal axis of the two-dimensional plot region 60 corresponds to the same third operational parameter VDD.

In some embodiments, the third operational parameters VDD can be set from various ranges (and with different step values) for testing, and the ranges to be set depend on the type of memory apparatus under test. For example, for a DDR SDRAM, the third operational parameters VDD can be from 2.2V to 2.8V; for a DDR2 SDRAM, the third operational parameters VDD can be from 1.6V to 2.0V, for a DDR3 SDRAM, the third operational parameters VDD can be from 1.3V to 1.7V, for a DDR4 SDRAM, the third operational parameters VDD can be from 1.1 to 1.3V, and, for a DDR5 SDRAM, the third operational parameters VDD can be from 1.0V to 1.2V. It can be contemplated that, however, any combinations of the noted range or any suitable range can be used for testing. Similarly, various step values of the third operational parameters VDD can also be set for testing. Small step values will result in many iterations for testing but a more precise target locking time may be determined. Large step values will result in fewer iterations for testing but a less precise target locking time may be determined.

Referring to FIG. 1 and FIG. 6, in some embodiments, the computing device 14 can be configured to determine the first candidate operational parameter based on a distribution of the first color and the second color on the two-dimensional plot region 60. Since a plot unit shows a second color when the DLL fails under the corresponding combination of the plot unit, the computing device 14, in some embodiments, can be configured to select the second candidate operational parameter which corresponds to a target locking time ensuring stability for all of the third operational parameters VDD.

For example, referring to FIG. 6, the dotted-line Tc2 may indicate a candidate locking time, and the second candidate operational parameter can be obtained accordingly.

In some embodiments, the computing device 14 can be configured to further compare the first candidate operational parameter and the second candidate operational parameter to determine the target locking time.

Figure 7:
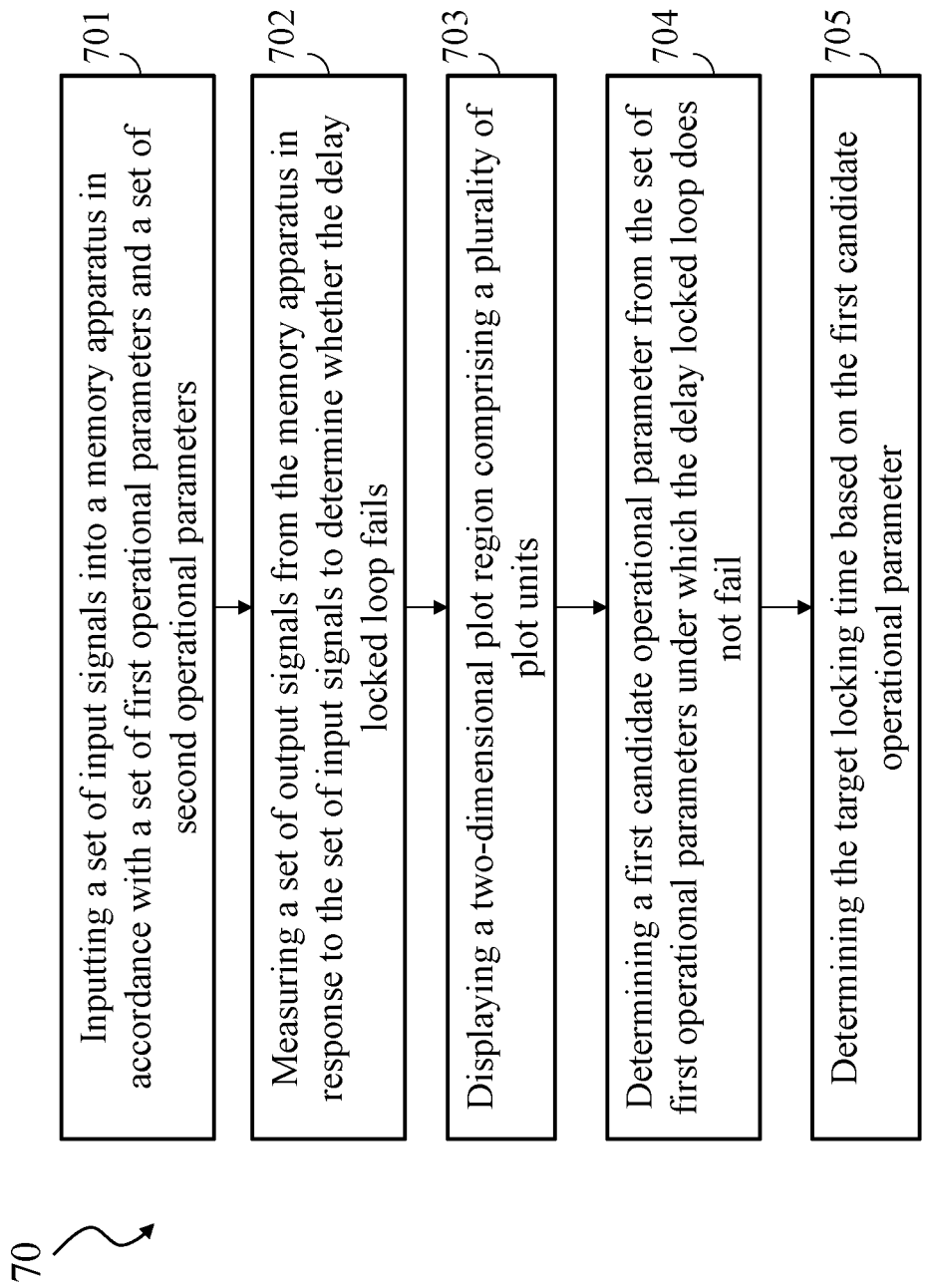
FIG. 7 is a flowchart of a method for determining a target locking time for a delay locked loop of a memory apparatus, in accordance with some embodiments of the present disclosure.

FIG. 7 is a flowchart of a method 70 for determining a target locking time for a delay locked loop of a memory apparatus, in accordance with some embodiments of the present disclosure. The method 70 can be utilized, for example, to determining a target locking time for a delay locked loop of a memory apparatus 11 of FIG. 1. The method 70 for determining target locking time for a delay locked loop of a memory apparatus 11 may include operations 701, 702, 703, 704, and 705. In some embodiments, the method 70 may be operated by a system as shown in FIG. 1. For better understanding, the method 70 is described referring the system 10 shown in FIG. 1 and the two-dimensional plot region 50 in FIG. 5.

In operation 701, a first set of input signals 111 are input to the memory apparatus 11 in accordance with a first set of first operational parameters 121 and a set of second operational parameters 122.

In operation 702, a first set of output signals 112 from the memory apparatus 11 are measured in response to the first set of input signals 111, and whether the delay locked loop of the memory apparatus 11 fails at any combination of the first set of first operational parameters 121 and the set of second operational parameters 121 is determined.

In operation 703, a two-dimensional plot region 50 comprising a plurality of plot units each corresponding to one combination of the first set of first operational parameters 121 and the set of second operational parameters 122 is displayed on the display device 15. In some embodiments, a plot unit 51 of the plurality of plot units shows a first color when the delay locked loop does not fail under the corresponding combination of the plot unit 51. In some embodiments, the plot unit 52 of the plurality of plot units shows a second color when the delay locked loop fails under the corresponding combination of the plot unit 52.

In operation 704, a first candidate operational parameter is determined from the first set of first operational parameters 121 under which the delay locked loop does not fail for each of the set of second operational parameters 122. In some embodiments, the first candidate operational parameter is determined based on a distribution of the first color and the second color on the two-dimensional plot region 50.

In operation 705, the target locking time is determined based on the first candidate operational parameter.

Figure 8:
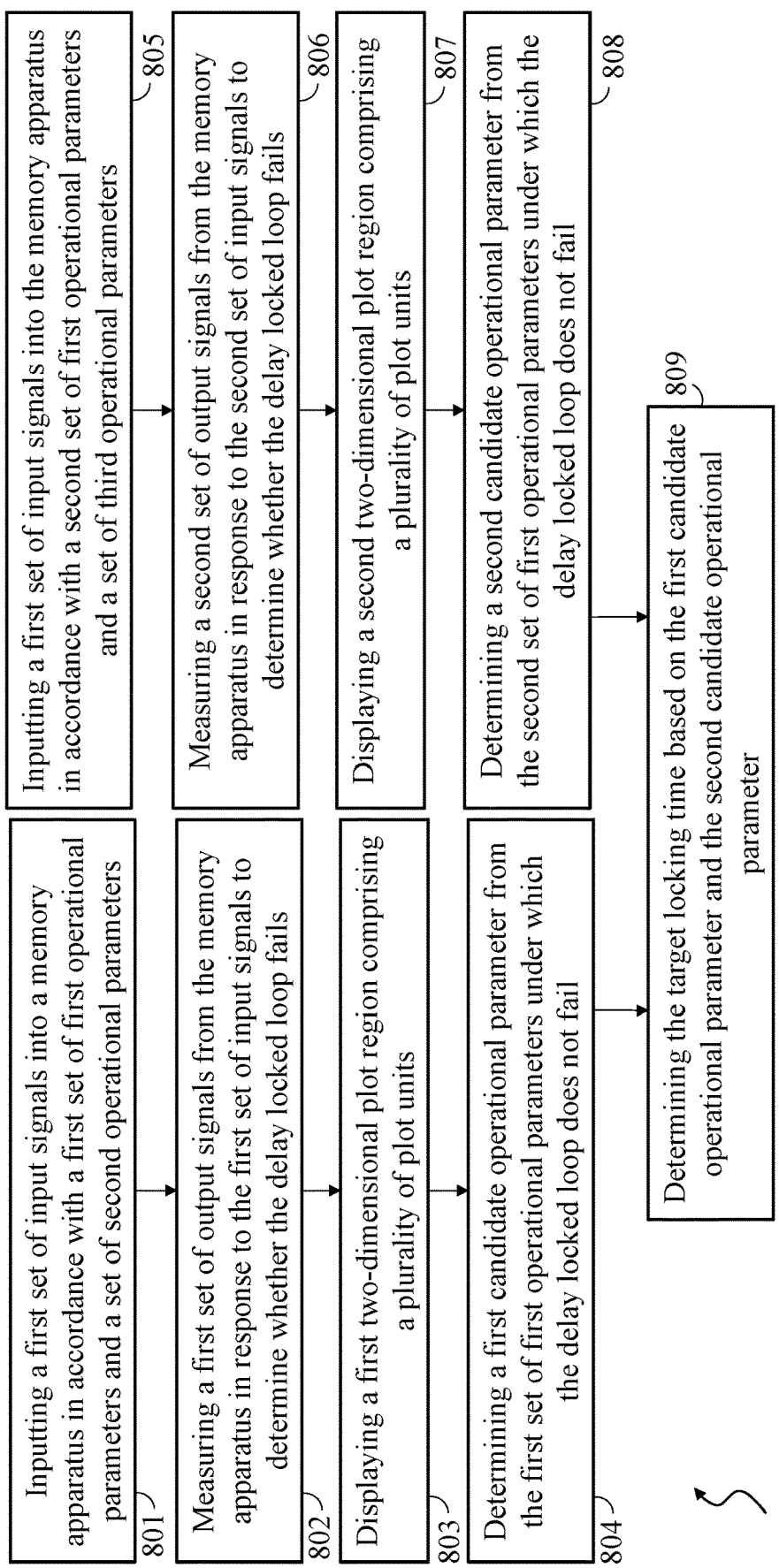
FIG. 8 is a flowchart of a method for determining a target locking time for a delay locked loop of a memory apparatus, in accordance with some embodiments of the present disclosure.

FIG. 8 is a flowchart of a method for determining a target locking time for a delay locked loop of a memory apparatus, in accordance with some embodiments of the present disclosure.

The method 80 can be utilized, for example, to determining a target locking time for a delay locked loop of a memory apparatus 11 of FIG. 1. The method 80 for determining target locking time for a delay locked loop of a memory apparatus 11 may include operations 801, 802, 803, 804, 805, 806, 807, 808, 809, and 810. In some embodiments, the method 80 may be operated by a system as shown in FIG. 1. For better understanding, the method 80 is described referring the system 10 shown in FIG. 1, the two-dimensional plot region 50 in FIG. 5 and the two-dimensional plot region 60 in FIG. 6.

In operation 801, a first set of input signals 111 are input to the memory apparatus 11 in accordance with a first set of first operational parameters 121 and a set of second operational parameters 122.

In operation 802, a first set of output signals 112 from the memory apparatus 11 are measured in response to the first set of input signals 111, and whether the delay locked loop of the memory apparatus 11 fails at any combination of the first set of first operational parameters 121 and the set of second operational parameters 121 is determined.

In operation 803, a two-dimensional plot region 50 comprising a plurality of plot units each corresponding to one combination of the first set of first operational parameters 121 and the set of second operational parameters 122 is displayed on the display device 15. In some embodiments, a plot unit 51 of the plurality of plot units shows a first color when the delay locked loop does not fail under the corresponding combination of the plot unit 51. In some embodiments, the plot unit 52 of the plurality of plot units shows a second color when the delay locked loop fails under the corresponding combination of the plot unit 52.

In operation 804, a first candidate operational parameter is determined from the first set of first operational parameters 121 under which the delay locked loop does not fail for each of the set of second operational parameters 122. In some embodiments, the first candidate operational parameter is determined based on a distribution of the first color and the second color on the two-dimensional plot region 50.

In operation 805, a second set of input signals 111 are input to the memory apparatus 11 in accordance with a second set of first operational parameters 121 and a set of third operational parameters 123. In some embodiments, the third operational parameters 123 are different from the second operational parameters 122.

In operation 806, a second set of output signals 112 from the memory apparatus 11 are measured to determine whether the delay locked loop fails at any combination of the second set of first operational parameters 121 and the set of third operational parameters 123.

In operation 807, a two-dimensional plot region 60 comprising a plurality of plot units each corresponding to one combination of the second set of first operational parameters and the set of third operational parameters is displayed on the display device 15. In some embodiments, a plot unit 61 of the plurality of plot units shows a first color when the delay locked loop does not fail under the corresponding combination of the plot unit. In some embodiments, the plot unit 62 of the plurality of plot units shows a second color when the delay locked loop fails under the corresponding combination of the plot unit.

In operation 808, a second candidate operational parameter of the second set of first operational parameters 121 under which the delay locked loop does not fail for each of the set of third operational parameters 123 is determined. In some embodiments, the second candidate operational parameter is determined based on a distribution of the first color and the second color on the two-dimensional plot region 60.

In operation 809, the target locking time is determined based on the first candidate operational parameter and the second candidate operational parameter.

One aspect of the present disclosure provides a system for determining a target locking time for a delay locked loop of a memory apparatus. The system includes a signal generating device, a measuring device and a computing device. The signal generating device is configured to provide a first set of input signals to the memory apparatus in accordance with a first set of first operational parameters and a set of second operational parameters. The measuring device is configured to measure a first set of output signals from the memory apparatus in response to the first set of input signals, and to determine whether the delay locked loop fails at any combination of the first set of first operational parameters and the set of second operational parameters. The computing device is configured to determine a first candidate operational parameter from the first set of first operational parameters under which the delay locked loop does not fail for each of the set of second operational parameters, and to further determine the target locking time based on the first candidate operational parameter.

Another aspect of the present disclosure provides a system for determining a target locking time for a delay locked loop of a memory apparatus. The system includes a signal generating device, a measuring device and a display device. The signal generating device is configured to provide a first set of input signals to the memory apparatus in accordance with a first set of first operational parameters and a set of second operational parameters. The measuring device is configured to measure a first set of output signals from the memory apparatus in response to the first set of input signals, and to determine whether the delay locked loop fails at any combination of the first set of first operational parameters and the set of second operational parameters. The display device includes a first two-dimensional plot region including a first plurality of plot units each corresponding to one combination of the first set of first operational parameters and the set of second operational parameters. A plot unit of the first plurality of plot units shows a first color when the delay locked loop does not fail under the corresponding combination of the plot unit, and wherein the plot unit of the plurality of plot units shows a second color when the delay locked loop fails under the corresponding combination of the plot unit.

Another aspect of the present disclosure provides a method for determining a target locking time for a delay locked loop of a memory apparatus. The method includes: inputting, by a system, a first set of input signals to the memory apparatus in accordance with a first set of first operational parameters and a set of second operational parameters; measuring, by the system, a first set of output signals from the memory apparatus in response to the first set of input signals, and to determine whether the delay locked loop fails at any combination of the first set of first operational parameters and the set of second operational parameters; determining, by the system, a first candidate operational parameter from the first set of first operational parameters under which the delay locked loop does not fail for each of the set of second operational parameters; and determining, by the system, the target locking time based on the first candidate operational parameter.

Under most of the circumstances, a memory apparatus should be stable after a relatively large locking time from the initial state. However, the memory apparatus may not actually need such a large locking time from the initial state to come into stable locking state. To more precisely obtain a target locking time, a system in accordance with some embodiments of the present disclosure can be used to determine a target locking time of the memory apparatus. With the method and system provided in the present disclosure, the latency of memory apparatus caused by improper locking time can be avoided.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A system for determining a target locking time for a delay locked loop (DLL) of a memory apparatus, the system comprising:
    a signal generating device configured to provide a first set of input signals to the memory apparatus in accordance with a first set of first operational parameters and a set of second operational parameters, wherein the first set of first operational parameters are associated with locking times of the memory apparatus, wherein the set of second operational parameters are associated with clock periods of the memory apparatus;
    a measuring device configured to receive and measure a first set of output signals from the memory apparatus in response to the first set of input signals, and to determine whether the delay locked loop fails at any combination of the first set of first operational parameters and the set of second operational parameters; and
    a computing device configured to determine a first candidate operational parameter from the first set of first operational parameters under which the delay locked loop does not fail for each of the set of second operational parameters, and to further determine the target locking time based on the first candidate operational parameter, wherein the first set of output signals are data strobe (DQS) signals of the memory apparatus, such that the DDL fails is determined based on whether the DQS signals are stable.

2. The system of claim 1, wherein:
    the signal generating device is further configured to provide a second set of input signals to the memory apparatus in accordance with a second set of first operational parameters and a set of third operational parameters, wherein the third operational parameters are associated with supply voltages of the memory apparatus;
    the measuring device is further configured to measure a second set of output signals from the memory apparatus in response to the second set of input signals, and to determine whether the delay locked loop fails at any combination of the second set of first operational parameters and the set of third operational parameters;
    the computing device is further configured to determine a second candidate operational parameter from the second set of first operational parameters under which the delay locked loop does not fail for each of the set of third operational parameters and to determine the target locking time based on both the first candidate operational parameter and the second candidate operational parameter.

3. The system of claim 1, further comprising:
    a display device that comprises a two-dimensional plot region comprising a plurality of plot units each corresponding to one combination of the first set of first operational parameters and the set of second operational parameters, wherein the two-dimensional plot region indicates a first candidate locking time in response to the locking times and the clock periods of the memory apparatus, such that the first candidate operational parameter is obtained accordingly;
wherein a plot unit of the plurality of plot units shows a first color when the delay locked loop does not fail under the corresponding combination of the plot unit, and wherein the plot unit of the plurality of plot units shows a second color when the delay locked loop fails under the corresponding combination of the plot unit.

4. The system of claim 2, further comprising:
a display device that comprises a two-dimensional plot region comprising a plurality of plot units each corresponding to one combination of the first set of first operational parameters and the set of second operational parameters and one combination of the second set of first operational parameters and the set of third operational parameters, wherein the two-dimensional plot region indicates a first candidate locking time in response to the locking times and the clock periods of the memory apparatus, such that the first candidate operational parameter is obtained accordingly, wherein the two-dimensional plot region further indicates a second candidate locking time in response to the locking times and the supply voltages of the memory apparatus, such that the second candidate operational parameter is obtained accordingly;
wherein a plot unit of the plurality of plot units shows a first color when the delay locked loop does not fail under the corresponding combination of the plot unit, and wherein the plot unit of the plurality of plot units shows a second color when the delay locked loop fails under the corresponding combination of the plot unit.

5. The system of claim 3, wherein the computing device determines the first candidate operational parameter based on a distribution of the first color and the second color on the two-dimensional plot region, and the corresponding first operational parameters of the plot units along one dimension of the two-dimensional plot region are arranged in ascending order.

6. The system of claim 5, wherein the corresponding second operational parameters of the plot units along the other dimension of the two-dimensional plot region are arranged in ascending order.

7. The system of claim 1, wherein the signal generating device automatically generates the first set of first operational parameters and the set of second operational parameters when a minimum value, a maximum value, and a step value thereof are input into the system.

8. The system of claim 1, wherein the first set of first operational parameters and the set of second operational parameters are manually input into the system.

9. The system of claim 2, wherein the signal generating device automatically generates the first set of first operational parameters, the set of second operational parameters, and the set of third operational parameters when a minimum value, a maximum value, and a step value thereof are input into the system.

10. The system of claim 1, wherein the first set of first operational parameters and the set of second operational parameters are previously stored in the signal generating device.

11. The system of claim 2, wherein the number of parameters of the set of the third operational parameters are different from the number of parameters of the set of the second operational parameters.

12. The system of claim 2, wherein the computing device compares the first candidate operational parameter derived from the first set of first operational parameters and the second candidate operational parameter derived from the second set of first operational parameters to determine the target locking time.

13. A system for determining a target locking time for a delay locked loop (DLL) of a memory apparatus, the system comprising:
a signal generating device configured to provide a first set of input signals to the memory apparatus in accordance with a first set of first operational parameters and a set of second operational parameters, wherein the set of first operational parameters are associated with locking times of the memory apparatus, wherein the set of second operational parameters are associated with clock periods of the memory apparatus;
a measuring device configured to measure a first set of output signals from the memory apparatus in response to the first set of input signals, and to determine whether the delay locked loop fails at any combination of the first set of first operational parameters and the set of second operational parameters; and
a display device that comprises a first two-dimensional plot region comprising a first plurality of plot units each corresponding to one combination of the first set of first operational parameters and the set of second operational parameters, wherein the two-dimensional plot region indicates a first candidate locking time in response to the locking times and the clock periods of the memory apparatus, such that the first candidate operational parameter is obtained accordingly
wherein a plot unit of the first plurality of plot units shows a first color when the delay locked loop does not fail under the corresponding combination of the plot unit, and wherein the plot unit of the plurality of plot units shows a second color when the delay locked loop fails under the corresponding combination of the plot unit.

14. The system of claim 13, further comprising:
a computing device configured to determine a first candidate operational parameter from the first set of first operational parameters based on a distribution of the first color and the second color on the first two-dimensional plot region, wherein the first set of output signals are data strobe (DOS) signals of the memory apparatus, such that the DDL fails is determined based on whether the DQS signals are stable.

15. The system of claim 14, wherein the computing device determines the target locking time based on the first candidate operational parameter.

16. The system of claim 13, wherein the corresponding first operational parameters of the plot units along one dimension of the first two-dimensional plot region are arranged in ascending order, and the corresponding second operational parameters of the plot units along the other dimension of the first two-dimensional plot region are arranged in ascending order.

17. The system of claim 14, wherein:
the signal generating device is further configured to provide a second set of input signals to the memory apparatus in accordance with a second set of first operational parameters and a set of third operational parameters, wherein the third operational parameters are associated with supply voltages of the memory apparatus;
the measuring device is further configured to measure a second set of output signals from the memory apparatus in response to the second set of input signals, and to determine whether the delay locked loop fails at any combination of the second set of first operational parameters and the set of third operational parameters, the display device that comprises a second two-dimensional plot region comprising a second plurality of plot units each corresponding to one combination of the second set of first operational parameters and the set of third operational parameters, wherein the second two-dimensional plot region further indicates a second candidate locking time in response to the locking times and the supply voltages of the memory apparatus, such that the second candidate operational parameter is obtained accordingly:

wherein a plot unit of the second plurality of plot units shows a first color when the delay locked loop does not fail under the corresponding combination of the plot unit, and the plot unit of the plurality of plot units shows a second color when the delay locked loop fails under the corresponding combination of the plot unit.

18. The system of claim 17, wherein the computing device determines a second candidate operational parameter of the second set of first operational parameters based on a distribution of the first color and the second color on the second two-dimensional plot region, and the corresponding first operational parameters of the plot units along one dimension of the second two-dimensional plot region are arranged in ascending order.

19. The system of claim 18, wherein the computing device compares the first candidate operational parameter derived from the first set of first operational parameters and the second candidate operational parameter derived from the second set of first operational parameters to determine the target locking time.

20. The system of claim 18, wherein the corresponding second operational parameters of the plot units along the other dimension of the second two-dimensional plot region are arranged in ascending order.

* * * * *